(12) United States Patent
Piirainen

(10) Patent No.: US 6,590,939 B1
(45) Date of Patent: Jul. 8, 2003

(54) RECEPTION METHOD AND A RECEIVER

(75) Inventor: Olli Piirainen, Oulu (FI)

(73) Assignee: Nokia Telecommunications OY, Espoo (FI)

(*) Notice: Subject to any disclaimer, the term of this patent is extended or adjusted under 35 U.S.C. 154(b) by 0 days.

(21) Appl. No.: 09/367,399

(22) PCT Filed: Feb. 25, 1998

(86) PCT No.: PCT/FI98/00171
§ 371 (c)(1),
(2), (4) Date: Aug. 13, 1999

(87) PCT Pub. No.: WO98/00171
PCT Pub. Date: Feb. 25, 1998

(30) Foreign Application Priority Data

Feb. 28, 1997 (FI) .................................................. 970888

(51) Int. Cl.⁷ ............................. H04L 5/12; H04L 27/06
(52) U.S. Cl. ........................................ 375/265; 375/341
(58) Field of Search ........................ 375/265, 260–264, 375/341, 233; 348/261, 21

(56) References Cited

U.S. PATENT DOCUMENTS

| | | | | |
|---|---|---|---|---|
| 4,614,935 A | * | 9/1986 | Fling | 341/106 |
| 5,119,400 A | | 6/1992 | Koch | |
| 5,162,797 A | | 11/1992 | Murata et al. | |
| 5,295,142 A | | 3/1994 | Hatakeyama | |
| 5,414,738 A | * | 5/1995 | Bienz | 348/261 |
| 5,530,707 A | | 6/1996 | Lin | |
| 5,537,424 A | | 7/1996 | Karabed et al. | |
| 5,933,462 A | * | 8/1999 | Viterbi et al. | 714/786 |
| 6,282,251 B1 | * | 8/2001 | Worstell | 375/341 |
| 6,302,576 B1 | * | 10/2001 | Ono et al. | 375/262 |

FOREIGN PATENT DOCUMENTS

| | | |
|---|---|---|
| EP | 0 603 824 | 6/1994 |
| EP | 0 731 567 | 9/1996 |
| EP | 0 748 057 | 12/1996 |
| EP | 0 827 299 | 3/1998 |

OTHER PUBLICATIONS

Proakis, J., "Signal Space Representations," Digital Communications, McGraw–Hill Book Company, 1989, Chapter 4–2, pp. 163–173.

Fettweis, G., "High–Speed Parallel Viterbi Decoding: Algorithm and VLSI–Architecture," IEEE Communications Magazine, vol. 29, May 1991, pp. 46–54.

Patent Abstracts of Japan, 82–28191 A (Nec Corp), Sep. 3, 1996.

Patent Abstracts of Japan, 92–84348 A (Ricoh Co Ltd), Oct. 31, 1997.

* cited by examiner

Primary Examiner—Stephen Chin
Assistant Examiner—Lawrence Williams
(74) Attorney, Agent, or Firm—Pillsbury Winthrop LLP

(57) ABSTRACT

The invention relates to a reception method and a receiver. Mechanisms are used for generating, at each level, numbers relating to a bit 1 and a bit 2 and representing a probability of a transition metric of survivor paths. Mechanisms are used for separately summing the numbers relating to the bit 1 and the bit 0 of more than one state and representing the probability of the transition metric. Mechanisms are used for generating logarithms of the sums and means for generating a difference of the logic numbers relating to the bit 1 and the bit 0 representing the probability of the transition metric, whereby a received bit can be determined without a correct path tracing phase.

10 Claims, 3 Drawing Sheets

RECEPTION METHOD AND A RECEIVER

This application is the national phase of International application PCT/FI98/00171, filed Feb. 25, 1998 which designated the U.S.

FIELD OF THE INVENTION

The invention relates to a reception method in which received symbols are functions of bits, which are detected at successive trellis levels A and B by adding to a sum of a transition metric of each path that has led to each state of the level A a transition metric of a path branch relating to a bit 1 and a bit 0 and leading to the next level B and; by comparing at the level B that follows the level A the sums of the transition metrics of path branches entering each state; and by selecting, on the basis of the sums of the transition metrics, in each state of the level B the best of the two paths as a survivor path.

The invention also relates to a reception method in which received symbols are functions of bits, which are detected at successive trellis levels A and B by adding to a sum of a transition metric of a path that has led to each state of the level A a transition metric relating to a bit 1 and a bit 0 and leading to the next level; by comparing the sums of the transition metrics of path branches entering each state at the level B that follows the level A; and by selecting, on the basis of the sums of the transition metrics, in each state of the level B the best of two paths as a survivor path.

The invention further relates to a receiver, which comprises means for forming a transition metric of a trellis, the means being used for determining bits relating to received symbols; and selecting means for adding to the sum of the transition metric of each path that has led to each state of the level A, of the two successive levels A and B, a transition metric of two path branches leading to the next level B; for comparing at the level B that follows the level A the sums of the transition metrics of the path branches entering each state; and for selecting, on the basis of the sums of the transition metrics, in each state of the level B the best of the two paths as a survivor path.

The invention further relates to a receiver comprising means for forming the transition metric of the trellis, the means being used for determining the bits relating to the received symbols; and selecting means for adding to the sum of the transition metric of each path that has led to each state of the level A, of the levels A and B, the transition metric of the two path branches leading to the next level; for comparing the sums of the transition metrics of the path branches entering each state at the level B that follows the level A; and for selecting, on the basis of the sums of the transition metrics, in each state of the level B the best of the two paths as a survivor path.

BACKGROUND OF THE INVENTION

In a finite-state, discrete-time Markov process, with white noise influencing the estimates usually made concerning the conditions of a digital cellular radio system, the Viterbi algorithm provides for sequence estimation an optimum recursive algorithm, which is not, however, equally good for detecting individual bits. A received signal can be Viterbi-decoded at a base station or at a subscriber terminal of a cellular radio system. In Viterbi-decoding of a receiver, the most probable sequence of transmitted data is searched for. Thus, in Viterbi-decoding, the symbols corresponding to the transmitted information are detected, the symbols representing the bits or bit combinations of the transmitted message. The Viterbi algorithm is used, as known, in signal detection and decoding. The Viterbi algorithm generates an ML (Maximum Likelihood) sequence estimate from a signal and typically also makes soft decisions for channel decoding functions. The ML estimate comprises estimates of the symbol sequences that the signal comprises. The ML method is discussed in Proakis, J., G., *Digital Communications*, McGraw-Hill Book Company, 1989, chapter 4.2 and the hardware implementation of the Viterbi algorithm is discussed in a publication by Fettweis, G., Meyer, H., *High-Speed Parallel Viterbi Decoding: Algorithm and VLSI Architecture*, IEEE Communications Magazine, Vol. 29(5), 1991, which are included herein as references.

A prior art Viterbi detector requires a correct path tracing phase for making a bit decision. This causes delay in the detection of the bits. In addition, the Viterbi detector falters, i.e. loses the correct path for the duration of several state transitions after having selected a wrong path branch even once.

SUMMARY OF THE INVENTION

An object of the present invention is thus to provide a reception method and a receiver similar to the Viterbi algorithm, the method and the receiver allowing direct bit decisions to be made, without employing the correct path tracing.

This is achieved with a method described in the preamble, characterized by generating at the level B, separately for each bit of a symbol, numbers relating to the bit 1 and bit 0 and representing a probability of the transition metrics of the survivor paths; separately summing the numbers relating to the bit 1 and the bit 0 of more than one state and representing the probability of the transition metric; generating logarithms of the sums; and generating a difference of the logarithms of the sums, a received signal being determined on the basis of the difference.

A method described in the preamble is further characterized by generating at the level B, separately for each bit in a symbol, numbers relating to the bit 1 and the bit 0 and representing the probability of the transition metric of the survivor paths; separately summing the numbers relating to the bit 1 and the bit 0 of more than one state and representing the probability of the transition metric; dividing the generated sums by each other; generating a logarithm of the quotient of the sums, a received bit being determined on the basis of the logarithm.

A receiver of the invention is characterized in that the receiver comprises means for generating at the level B, separately for each bit of a symbol, numbers relating to the bit 1 and the bit 0 and representing the probability of the transition metric of the survivor paths; means for separately summing at the level B the numbers relating to the bit 1 and the bit 0 of more than one state and representing the transition metric; means for storing the results of the summation of the numbers representing the probability of the transition metric; means for generating logarithms of said sums; and means for generating a difference of the logarithms of the sums, allowing thus a direct decision to be made on a received bit.

A receiver of the invention is further characterized in that the receiver comprises means for generating at the level B, separately for each bit of the symbol, the numbers relating to the bit 1 and the bit 0 and representing the probability of the transition metric of the survivor paths; means for separately summing the numbers relating to the bit 1 and the bit 0 of more than one state and representing the probability of the transition metric; means for storing the results of the summation of the numbers representing the probability of the transition metric; means for generating a quotient of the summation results of the numbers representing the probability of the transition metric formed by the means; and means for generating a logarithm of said divided sums to determine a received bit.

The method of the invention provides significant advantages: it enhances detection performance, speeds up bit decisions and removes faltering typical of a prior art Viterbi detection.

BRIEF DESCRIPTION OF THE DRAWINGS

In the following the invention will be described in greater detail with reference to examples given in the attached drawings, in which.

DESCRIPTION OF PREFERRED EMBODIMENTS

Figure 1:
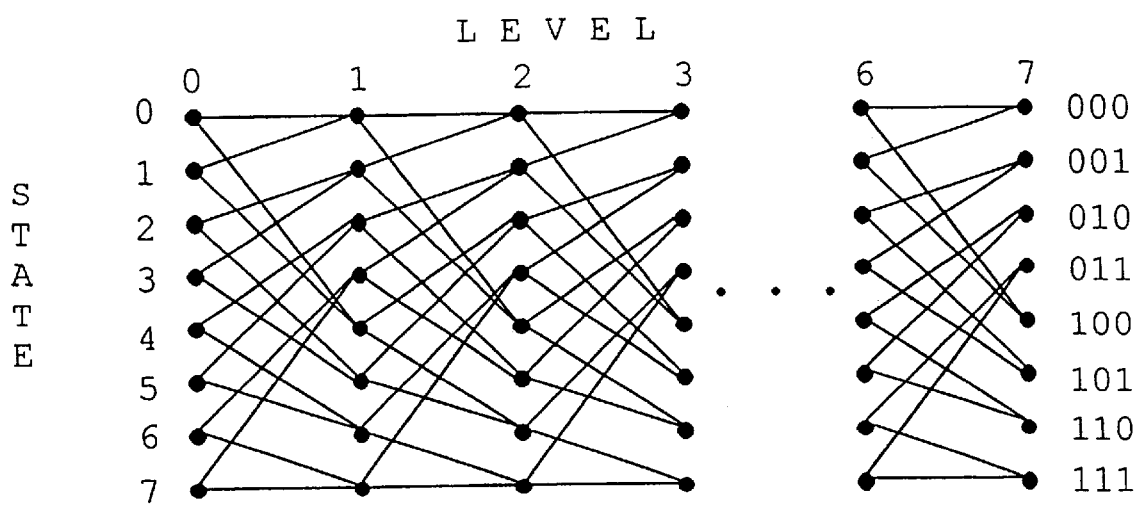
FIG. 1 illustrates a trellis diagram.

A solution of the invention can be applied to digital radio systems employing a Viterbi algorithm, particularly to a GSM radio system, without being, however, restricted to it. Data samples y of a signal received in a radio system can be expressed as follows:

$$y = HS + n, \quad (1)$$

where H is a channel estimate, i.e. an impulse response estimate, S represents the transmitted data, n represents noise and interference. Bold type is used to show that the character concerned is a vector or a matrix. Let us first study the theoretical basis of the solution of the invention. A group B with two elements is determined. The group B is called a bit B={$a_0, a_1$}, where $a_0$ is for instance 0 and $a_1$ is for instance 1. A symbol $S_i$ can then be determined by means of sequences formed of bits x:

$$S_i = f(x_{i,N-1}, x_{i,N-2}, \ldots x_{i,0}); \, x_{i,N-1} \in B \wedge x_{i,n-2} \in B \wedge \ldots \wedge x_{i,0} \in B, \quad (2)$$

which means that the symbol $S_i$ is a function of the bits $x_{i,N-1}, x_{i,N-2}, \ldots x_{i,0}$. The sign $\Lambda$ in formula (3) is an AND-sign. In this expression N represents the number of the bits.

As long as a memoryless channel, i.e. a Markov process, is concerned, the probability function of a received bit $p(x_n|y)$ takes the form $$p(x_n|y) = \sum_i \frac{p(y|x_n, x_i) p(x_n, x_i)}{p(y)} \quad (3)$$

where i is an index of the summation, $x_n$ represents the $n^{th}$ bit, which is 1 (or, alternatively, 0). The bits as such are typically mapped as values [-1, 1] to facilitate the calculation. The output of a Viterbi detector functioning according to prior art is a log-likelihood function of the received bit, required by other parts of the receiver. This is a function generated by indicating a reverse bit of $x_n$ with a character $\bar{x}_n$, so if $x_n$ is 1, then $\bar{x}_n$ is 0 and vice versa; by dividing their probabilities and by generating a logarithm, whereby the log-likelihood function expressed with the formula (2) takes the following form $$\ln \frac{p(x_n|y)}{p(\bar{x}_n|y)} = \ln\left(\sum_i p(y|x_n, x_i)\right) - \ln\left(\sum_i p(y|\bar{x}_n, x_i)\right), \quad (4)$$

from where p(y) has been cancelled out. The assumption that the likelihood is Rayleigh distributed as follows $$p(y|x) = \frac{1}{2\Pi \sigma^2} e^{\left(\frac{-|y-Hx|^2}{2\sigma^2}\right)}, \quad (5)$$

where $\sigma$ is the magnitude of the interference, allows the formula (4) to be further written, in a manner suitable to the Forney metric, into the following form $$\ln \frac{p(x_n|y)}{p(\bar{x}_n|y)} = \ln\left(\sum_i e^{\left(\frac{-|y-Hx|^2}{2N}\right)}\right) - \ln\left(\sum_i e^{\left(\frac{-|y-Hx|^2}{2N}\right)}\right), \quad (6)$$

where N is the effective value $\sigma^2$ of the interference and it is calculated as a signal variance, x denotes a bit sequence comprising $x_n$ and $\bar{x}$ denotes a sequence comprising $\bar{x}_n$. Also other symbols can be used instead of bits, in a manner apparent to a person skilled in the art. In the formula (6), the effective value of the interference can be further multiplied by a constant when the formula is applied to the inventive method. The Ungerboeck metric denoted with the letter J can, in turn, be utilized to write the formula (6) to still another form $$L = \ln \frac{p(x_n|y)}{p(\bar{x}_n|y)} = \ln\left(\sum_i e^{\frac{J}{2N}}\right) - \ln\left(\sum_i e^{\frac{\bar{J}}{2N}}\right), \quad (7)$$

where J denotes a metric relating to the sequence $x_n$ and $\bar{J}$ denotes a metric relating to the sequence $\bar{x}_n$. Also another metric, for instance the Forney metric, can be used instead of the Ungerboeck metric. The Ungerboeck metric is determined as $J = 2\text{Re}[y(H/X)^H)] + x^H H^H H x$, of which $2\text{Re}[y(Hx)^H)]$ is a term corresponding to a matched filter and $x^H H^H H x$ is a term corresponding to reference values that do not depend on the received symbol. Instead of real probabilities, it is possible or advantageous to use values describing or representing a probability. On the basis of the formula (7), the log-likelihoods of the bits in a received sequence can be determined by using an algorithm of the invention.

Let us now study more in detail an algorithm of the invention on the basis of the trellis diagram in FIG. 1, which comprises, by way of example, only 8 states (STATE) and 8 levels (LEVEL). The trellis diagram proceeds from left to right, which represents the chronological order of the events taking place in the trellis. Transition can be used for proceeding from a point, i.e. a state, of each level to N different states of the next level over two different paths, depending on the received bit (the bit is either 1 or 0). A state in a metric represents a window, displaying only a few bits at a time, in an infinite bit sequence (in the present example a window comprises 3 bits, because each level only comprises 8 states). From the sequence of a few bits appearing on the window, one bit is always omitted as the metric proceeds from one level to another and at the same time a new, received bit enters the sequence at its opposite end. For the received bit to be determined, in each state the best of the paths, i.e. a survivor, entering the state is selected and the data concerned is stored into a memory.

Let us now study the two successive trellis levels A and B. Let us assume that the level concerned is level 3, which is thus level B. In the inventive method, to the sum of the transition metric of the survivor that has led to each state at level 2, i.e. the level A, is added the transition metric of the path branch relating to the bit 1 and the bit 0 and leading to the next level. From state 1, i.e. from state 001 when denoted as a three-bit window, at level 3, the bit 1 is used for moving to state 4, i.e. 100 in binary form, at level 3. The transition of the states, represented by $$\frac{J}{2N}$$

and $$\frac{\overline{J}}{2N}$$

in the formula (7), between the levels can commonly be written to the bit 1 as follows: TRAN(REM(2*i+1, MS), i), where i is an integer between [0, MS], MS representing the number of the trellis states and REM denoting a remainder function which functions as follows:

| i | REM(2*i, 8) | REM(2*i + 1, 8) |
|---|---|---|
| 0 | 0 | 1 |
| 1 | 2 | 3 |
| 2 | 4 | 5 |
| 3 | 6 | 7 |
| 4 | 0 | 1 |
| 5 | 2 | 3 |
| 6 | 4 | 5 |
| 7 | 6 | 7 |

The transitions of the bit 0, in turn, take the form TRAN (REM(2*i, MS), i). The transition TRAN(f(i), i) where f(i) is REM(2*i+1, MS) or REM(2*i, MS) advantageously describes a logarithmic probability of a transition taking place between states of two different levels. As distinct from the prior art, the transition is scaled in the inventive method on the basis of the magnitude N of the instants of interference, as shown in the formulas (6) and (7). The sums of the transition metrics of the path branches entering each state at the level B that follows said level A are then compared in the inventive method, and the best path, i.e. the most probable one, of two paths in each state at level 3 is selected, on the basis of the sums of the transition metrics, as the survivor path.

At a particular level, which may again be for instance level 3, of the inventive method, the bit 1 and the bit 0 are associated with numbers, such as $e^{(TRAN(f(i),\ i))} = e^{\wedge}(\text{TRAN}(f(i), i))$, representing the probability of the transition metric of the survivor paths. Instead of a radix e, it is possible to use a radix a, which is arbitrary real number, the number representing the probability then taking the form a^(TRAN (f(i), i)) =a^[(b^x|y−HS|²/(2N)]. The only difference from a conventional Viterbi detection is that the instants of interference N are taken into account in the transition. The argument TRAN(f(i), i) is then preferably weighted by a number b, which is also arbitrary real number. The number a, however, is preferably a number e or a number 2, the number b being then preferably ∓1 or ∓ln2, where ln is a natural algorithm. The numbers $e^{TRAN(f(i),\ i))}$ relating to the bit 1 and the bit 0 of more than one state and representing the probability are then separately summed, logarithms of the sums are generated and a difference L of the logarithmic numbers relating to the bit 1 and the bit 0 and representing the probability of the transition metric is produced according to the following formula $$L = \log\left(\sum_i e^{TRAN(REM(2^*i+1,\ MS),\ i)}\right) - \log\left(\sum_i e^{TRAN(REM(2^*i,\ MS),\ i)}\right), \quad (8)$$

where log is preferably a natural logarithm. As regards the formula (8), it is to be noted that a mathematical equivalent to any logarithm is log(p)−log(r)=log(p/r), so the same result is also arrived at by dividing the sums and generating a logarithm of the divided sums. When the number L representing the bit likelihood is greater than 0, the bit is 1 and when L is smaller than 0, the bit is 0. This kind of processing of results provides an example of a hard bit decision. The result as such is, however, a soft bit decision, i.e. it shows the degree of certainty of a bit being 1 or 0. The number used as the radix of the logarithmic function of the sums of the numbers representing the probability of the transition metric is most advantageously number 2, instead of the Neper number e, because the use of the radix 2 facilitates floating point number operations in a system of binary numbers.

The estimated impulse response is adaptively controlled in the invention by means of the detection results obtained. This can be carried out by minimizing the quadratic error. A common Least Square problem (LSE problem) can be solved by using a Kalman Filter, an Extended Kalman Filter, a Recursive Least Square (RLS) Filter, a Least Mean Square (LMS) Filter.

In the inventive method, the metric to be used in the detection is controlled when an impulse response estimate is available. The operation is carried out by using bit likelihoods or probabilities for making preferably hard bit decisions and by using the hard bit decisions for generating symbols. The impulse response and the generated symbols are used for generating reference samples and the reference samples are compared to corresponding received samples by using the least square sum method, or the like. The metric used in the detection can then be controlled by means of the result of the least square sum generated by the comparison of the reference samples and the received samples, the result advantageously providing a new impulse response estimate Ĥ. The metric is then controlled by changing the impulse response estimate Ĥ towards a gradient of a change in the least square sum method. The magnitude of the impulse response estimate Ĥ is advantageously controlled followingly:

$$\text{res\_vec=create\_symbol}\{\text{hard}([\text{out}_k, \ldots, \text{out}_{k-l}])\}; \text{dist}=y_k-\hat{h}^*\text{res\_vec}^{H,}, \hat{H}=\hat{H}+\text{mu}^*\text{dist}^*\text{res\_vec}; \quad (9)$$

where res_vec is an $\text{out}_k, \ldots, \text{out}_{k-r}$ vector of hard bit decisions, $y_k$ is a symbol vector of a received signal, Ĥ is an impulse response estimate vector, dist is a difference vector of signal samples and reference samples, Ĥ*res_vec is a reference symbol vector and mu=[0, 1] acts as a weighting coefficient of a change towards the gradient. If mu is 0, the impulse response estimate is not changed. On the basis of a simulation, a good value for the parameter mu is for instance 1/128.

When hard bit decisions of received bits are made, convolution of hard bit decisions and impulse response are used for generating reference samples. In a general case, convolution is calculated for instance on the basis of an impulse response H and sample estimates S estimated according to the following formula (10)

$$(H*\hat{S})_j = \Sigma h_j \cdot \hat{S}_{i-j}, \quad (10)$$

where i and j are indices denoting elements. The reference samples are then temporally compared to corresponding received samples by employing the least square sum method shown in formula (11)

$$LS = \Sigma |y - H*\hat{S}|^2, \quad (11)$$

where LS is the result of the least square sum. The result LS obtained by a comparison of the reference samples and the received samples is used for controlling the metric used in the detection by changing the impulse response H.

Figure 2:
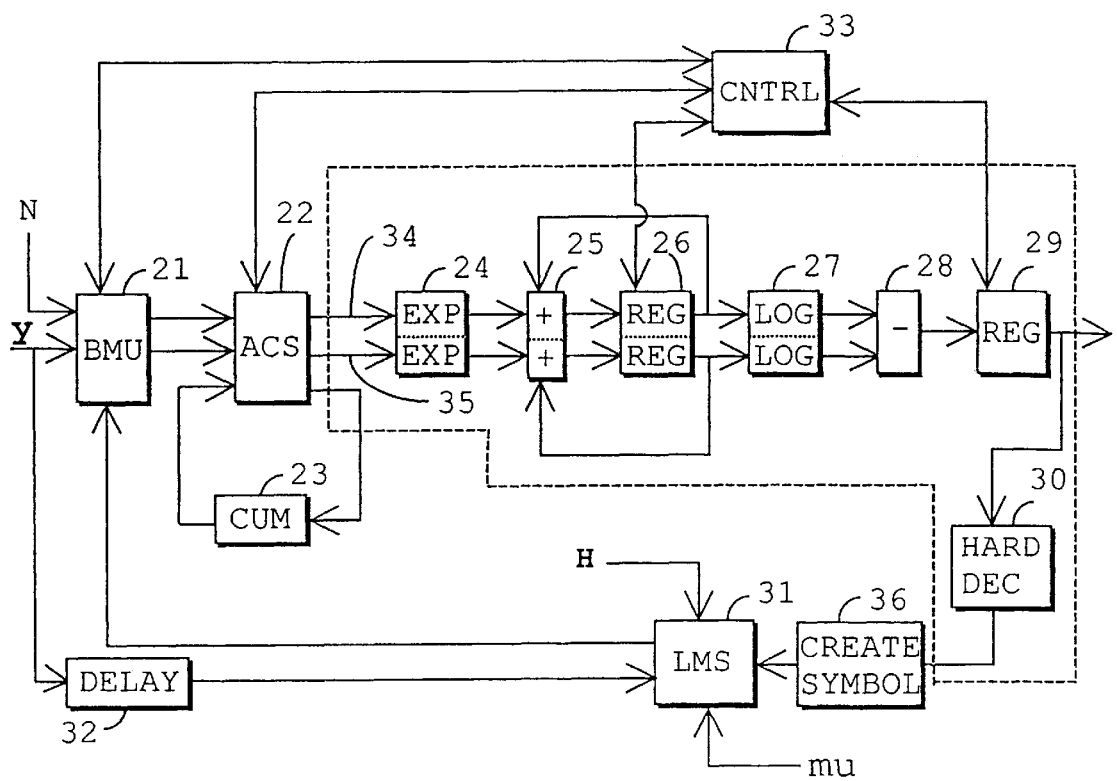
FIG. 2 illustrates a reception decoder.

Decoding according to the inventive method can be carried out in the detection part, illustrated by a block diagram in FIG. 2, of the receiver. The decoder concerned comprises a transition metrics unit 21, which can mainly be also a prior art Transition/Branch Metrics Unit (BMU) or a matched filter, and an Add-Compare-Select Unit (ACS). 22, a Cumulative Metrics Memory (CUM) 23, means 24 for generating an exponent, means 25 for generating a sum, registers 26, means 27 for generating a logarithm, means 28 for generating a difference, register 29. The inventive solution also advantageously comprises means 30 for making a hard bit decision, means 36 for generating a symbol, means 31 for generating a least square sum, means 32 for generating a delay and means 33 for controlling the operation of the detection part. The inventive solution comprises, at least in principle, a plural number of blocks 24 to 30, shown inside a dashed line, their number advantageously corresponding to the number of bits needed in the coding.

The received samples are fed into a transition metrics calculation unit 21, which also receives information about signal variance N. In the transition metrics unit 21 is generated, in each state, a value corresponding to a transition to said state from each of the possible states. When the Ungerbock metric is used, the output of means 21 is 2Re[y (H/X)$^H$], which corresponds to a matched filter, and x$^H$H$^H$Hx, which can be formulated in advance in every Viterbi state as reference values. The superscript H denotes a transpose of a complex conjugate. Neither the operation of the means 21 nor the metric is, however, essential from the point of view of the primary idea of the invention. In the selection unit 22 the transitions are added to the sum to be obtained from the cumulative metrics unit 23, the cumulative sums of the transitions of the paths are compared with each other, the best one of the results is selected, and said result is added to the sum obtained from the cumulative metrics unit 23, the result being stored into the cumulative metrics unit 23 as a new sum for the calculation of the next column. In the cumulative metrics 23 are stored the values so far calculated for each state of a level, i.e. a column.

In FIG. 2, the transition TRAN(REM(2*i+1, MS), i) relating to the bit 1 is denoted with number 34 and operations concerning the transition are performed in the upper part of the means 24 to 27. The transition TRAN(REM(2*i, MS), i) relating to the bit 0 is, in turn, denoted with number 35 and operations concerning the transition are performed in the lower part of the means 24 to 27. In the inventive detection part, the transitions TRAN(f(i), i) relating to the bit 1 and the bit 0 proceed from the means 22 to the means 24, in which they are used for generating a value describing the bit likelihood substantially according to the Rayleigh distribution in the formula (5). In the means 25 the values describing the likelihood are summed to corresponding values of other states stored in the registers 26. The values of all states of a level are preferably taken into account in the summation, although for the inventive solution it is sufficient that the values relating to more than one state are taken into account. In the means 27 is generated a logarithm of the sum of the bit likelihoods and the difference of the logarithmic sums is generated in the means 28. This difference, which corresponds to a bit decision, is preferably stored into the register 29.

To enhance the inventive solution, the bit decisions are made into hard bit decisions in the means 30 and the symbol estimate S of the received symbol is generated in the means 36. The symbol estimate S further proceeds to the means 31, which also receives the impulse response H. The impulse response H and the symbol estimate S are used for generating a convolution by using reference samples, which are subtracted in a squared form according to the formula (10) from the samples y of a signal received, the samples also arriving at the means 31 after having been delayed in the means 32. The least square result thus generated in the means 31 is used for controlling the metric in the means 21 by changing the estimated impulse response H as needed. The changing of the impulse response H improves the operation of the inventive solution.

Figure 3:
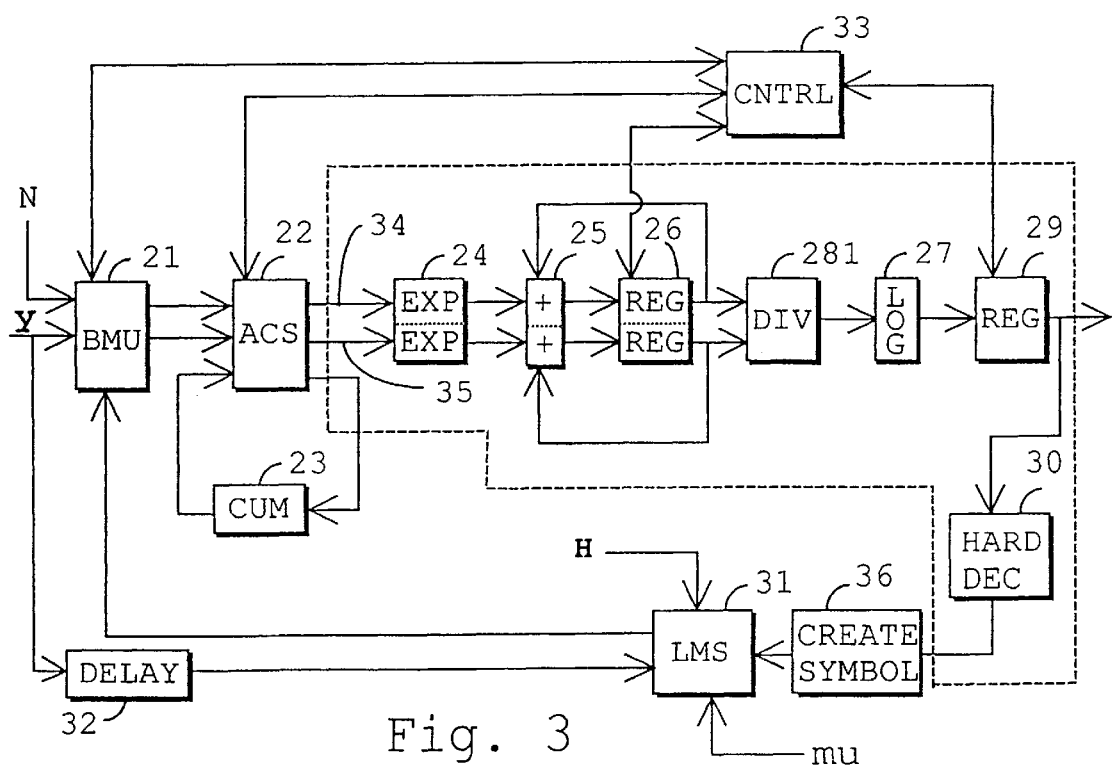
FIG. 3 illustrates a receiver.

FIG. 3 illustrates a block diagram of a receiver of the invention. The receiver is otherwise similar to the receiver in FIG. 2, except that means 281 are used in the receiver for dividing the values summed and stored in the means 25 and 26. From the quotient is generated a logarithm by using the means 27 and the result is advantageously stored into the register 29. The inventive solutions comprises, at least in principle, a plural number of blocks 24 to 30 and 281, shown inside a dashed line, their number preferably corresponding to the number of bits needed in the coding of the symbols.

The inventive solution is particularly characterized in that a Survivor Memory Unit (SMU), in which the correct path tracing is performed in a prior art detection-Viterbi, is not needed.

The magnitude of the channel interference required in the inventive solution is calculated for instance followingly. A comparison signal YR is first generated, preferably as a convolution, using an estimated channel impulse response and a predetermined sequence, such as a training sequence of the GSM system, and then an interference energy N is calculated, in a variance-type manner, on the basis of the comparison signal and the predetermined sequence of the signal received from the channel. The comparison signal YR obtained and the received signal Y, which is the received predetermined sequence, are used for calculating a variance-type result N by using the formula (3).

$$N = \frac{\sum_i [Re(Y(i) - YR(i))^2 + Im(Y(i) - YR(i))^2]}{Q}, \quad (12)$$

where Q is an arbitrary constant.

Figure 4:
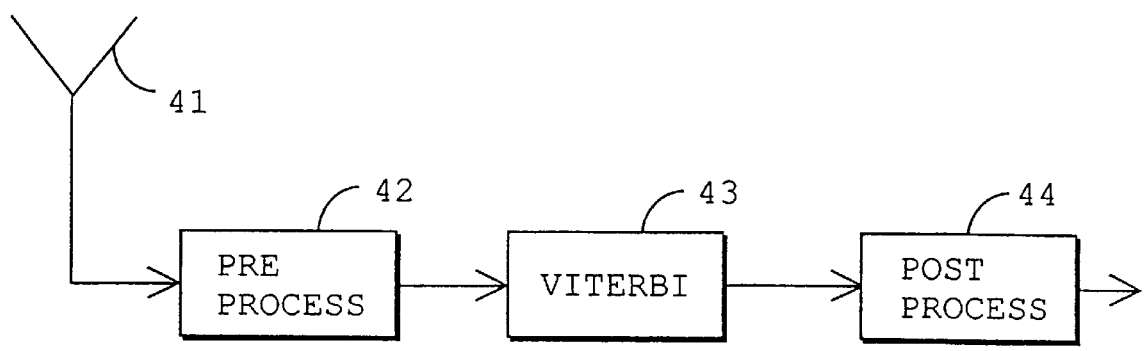
FIG. 4 illustrates a receiver.

FIG. 4 illustrates a block diagram of a receiver of the invention. The receiver comprises an antenna 41, pre-processing means 42, a detection part 43 and post-processing means 44. A radio frequency signal arriving from the antenna 41 proceeds to the pre-processing means 42 which comprises a mixer, a filter and an A/D converter. The mixer and the filter convert the signal to a lower frequency after which the signal is digitized in the A/D converter. The pre-processing means also generate an estimated impulse response h and a signal variance N. By using the method of the invention, the digital signal is processed in the detection part 43, which comprises the means 21 to 29 and preferably also the means 30 to 33. The signal then proceeds in means 44 to processes which, although not essential to the invention, are functions essential to the operation of the base station or the subscriber terminal.

Solutions of the invention can be provided, particularly as regards digital signal processing, for instance by means of ASIC or VLSI circuits (Application-Specific Integrated Circuit, Very Large Scale Integration). The operations to be performed are advantageously carried out as programs based on microprocessor technology.

Although the invention is described above with reference to an example according to the attached drawings, it is apparent that the invention is not restricted to it, but it can be varied in many ways within the scope of the inventive idea presented in the attached claims.

What is claimed is:

1. A reception method in which received symbols are functions of bits, which are detected at successive trellis levels A and B by adding to a sum of a transition metric of each path that has led to each state of level A a transition metric of a path branch, relating to a bit 1 and bit 0, that leads to the next level B and; by comparing at the level B that follows the level A the sums of the transition metrics of path branches entering each state; and by selecting, on the basis of the sums of the transition metrics, in each state of the level B the best of the two paths as a survivor path, the method comprising:

generating at the level B, separately for each bit of a symbol, numbers relating to the bit 1 and bit 0 that represent a probability of the transition metrics of the survivor paths;

separately summing the numbers, relating to the bit 1 and the bit 0 of more than one state, that represent the probability of the transition metric;

generating logarithms of the sums; and generating a difference between the logarithms of the sums, a received signal being determined on the basis of the difference.

2. A reception method in which received symbols are functions of bits, which are detected at successive trellis levels A and B by adding to a sum of a transition metric of each path that has led to each state of level A a transition metric of a path branch, relating to a bit 1 and bit 0, that leads to the next level and; by comparing at the level B that follows the level A the sums of the transition metrics of path branches entering each state; and by selecting, on the basis of the sums of the transition metrics, in each state of the level B the best of the two paths as a survivor path, the method comprising:

generating at the level B, separately for each bit of a symbol, numbers relating to the bit 1 and bit 0 and representing a probability of the transition metrics of the survivor paths;

separately summing the numbers relating to the bit 1 and the bit 0 of more than one state and representing the probability of the transition metric;

dividing the generated sums by each other;

generating a logarithm of a quotient of the generated sums, a received bit being determined on the basis of the logarithm.

3. A method according to claim 1 or 2, wherein, when the transition metric is formed, the impact of interference is taken into account.

4. A method according to claim 1 or 2, wherein the number used as a radix of a logarithmic function of the sums is 2.

5. A method according to claim 1 or 2, wherein when an impulse response is available, the received bits are used for making hard bit decisions;

the hard bit decisions are used for generating symbols;

said symbols and the impulse response are used for generating reference samples;

the reference samples are compared to corresponding received samples by using the least square sum method; and the result obtained by the comparison of the reference samples and the received samples is used for controlling the metric used in detection.

6. A receiver, which comprises:

means for forming a transition metric of a trellis, the means for forming being used for determining bits relating to received symbols;

selecting means for adding to a sum of a transition metric of each path that has led to each state of a level A, of two successive levels A and B, a transition metric of two path branches leading to the next level B; for comparing at the level B that follows the level A the sums of the transition metrics of the path branches entering each state; and for selecting, on the basis of the sums of the transition metrics, in each state of the level B the best of the two paths as a survivor path;

means for generating at the level B, separately for each bit of a symbol, numbers relating to a bit 1 and a bit 0 and representing a probability of the transition metric of the survivor paths;

means for separately summing at the level B the numbers relating to a bit 1 and a bit 0 of more than one state and representing the transition metric;

means for storing the results of the summation of the numbers representing the probability of the transition metric;

means for generating logarithms of said sums; and means for generating a difference of the logarithms of the sums, allowing thus a direct decision to be made on a received bit.

7. A receiver, which comprises:

means for forming a transition metric of a trellis, the means being used for determining bits relating to received symbols;

selecting means for adding to a sum of a transition metric of each path that has led to each state of level A, of two successive levels A and B, a transition metric of two path branches leading to the next level B; for comparing at the level B that follows the level A the sums of the transition metrics of the path branches entering each state; and for selecting, on the basis of the sums of the transition metrics, in each state of the level B the best of the two paths as a survivor path;

means for generating at the level B, separately for each bit of a symbol, numbers relating to a bit 1 and a bit 0 and representing a probability of the transition metric of the survivor paths;

means for separately summing at the level B the numbers relating to a bit 1 and a bit 0 of more than one state and representing the transition metric;

means for storing the results of the summation of the numbers representing the probability of the transition metric;

means for generating a quotient of the summation results of the numbers representing the probability of the transition metric formed by the means for separately summing and means for storing; and means for generating a logarithm of said divided sums to determine a received bit.

8. A receiver according to claim 6 or 7, wherein the means for forming a transition metric is arranged to take the impact of interference into account when the transition metric is formed.

9. A receiver according to claim 6 or 7, wherein the number used as the radix of the logarithmic function in the means generating a logarithm is number 2.

10. A receiver according to claim 6 or 7, wherein the receiver further comprises means for using the received bits for making hard bit decisions;

means for using the hard bit decisions for generating symbols;

means for using said symbols and an impulse response for generating reference samples, for comparing the reference samples to corresponding received samples by using the least square sum method and for using the result obtained by the comparison for controlling the means for forming a transition metric.

* * * * *

UNITED STATES PATENT AND TRADEMARK OFFICE
CERTIFICATE OF CORRECTION

PATENT NO. : 6,590,939 B1
DATED : July 8, 2003
INVENTOR(S) : Piriainen

It is certified that error appears in the above-identified patent and that said Letters Patent is hereby corrected as shown below:

Title page,
Item [87], should read as follows:
-- [87]  PCT Pub. No.   WO98/38747
          PCT Pub. Date: Sept.3, 1998 --

Signed and Sealed this

Seventh Day of September, 2004

JON W. DUDAS
*Acting Director of the United States Patent and Trademark Office*